(12) United States Patent
Arcuri et al.

(10) Patent No.: US 9,305,907 B2
(45) Date of Patent: Apr. 5, 2016

(54) OPTOELECTRONIC INTEGRATED DEVICE INCLUDING A PHOTODETECTOR AND A MOSFET TRANSISTOR, AND MANUFACTURING PROCESS THEREOF

(71) Applicant: STMicroelectronics S.r.l., Agrate Brianza (IT)

(72) Inventors: Luigi Arcuri, Misterbianco (IT); MariaEloisa Castagna, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 97 days.

(21) Appl. No.: 14/206,328

(22) Filed: Mar. 12, 2014

(65) Prior Publication Data
US 2014/0284669 A1    Sep. 25, 2014

(30) Foreign Application Priority Data

Mar. 22, 2013   (IT) .............................. TO2013A0236

(51) Int. Cl.

| | |
|---|---|
| *H01L 25/16* | (2006.01) |
| *H01L 27/06* | (2006.01) |
| *H01L 27/07* | (2006.01) |
| *H01L 27/146* | (2006.01) |
| *H03K 17/785* | (2006.01) |
| *H01L 27/144* | (2006.01) |
| *H01L 29/78* | (2006.01) |

(52) U.S. Cl.
CPC .......... *H01L 25/167* (2013.01); *H01L 27/0617* (2013.01); *H01L 27/0629* (2013.01); *H01L 27/0635* (2013.01); *H01L 27/0716* (2013.01); *H01L 27/1443* (2013.01); *H01L 27/14623* (2013.01); *H01L 27/14681* (2013.01); *H03K 17/785* (2013.01); *H01L 29/7803* (2013.01); *H01L 29/7808* (2013.01); *H03K 2217/0036* (2013.01)

(58) Field of Classification Search
CPC .................................................. H01L 27/0716
See application file for complete search history.

(56) References Cited

U.S. PATENT DOCUMENTS

| | | | |
|---|---|---|---|
| 5,360,987 A | 11/1994 | Shibib | |
| 5,779,918 A * | 7/1998 | Inoue | H01L 27/1443 216/2 |
| 5,841,565 A * | 11/1998 | Kanai | H01L 27/1443 257/433 |
| 2003/0168658 A1* | 9/2003 | Fukushima | H01L 27/1443 257/48 |
| 2009/0140367 A1* | 6/2009 | Iwai | H01L 31/10 257/462 |
| 2009/0230498 A1* | 9/2009 | Iwai | H01L 27/1443 257/461 |
| 2010/0127314 A1* | 5/2010 | Frach | H01L 27/1443 257/292 |

FOREIGN PATENT DOCUMENTS

| | | |
|---|---|---|
| DE | 2625917 A1 | 12/1976 |
| WO | WO2010106113 A2 | 9/2010 |

* cited by examiner

*Primary Examiner* — Daniel Luke
(74) *Attorney, Agent, or Firm* — Allen, Dyer, Doppelt, Milbrath & Gilchrist, P.A.

(57) ABSTRACT

An optoelectronic integrated device includes a body made of semiconductor material, which is delimited by a front surface and includes a substrate having a first type of conductivity, an epitaxial region, which has the first type of conductivity and forms the front surface, and a ring region having a second type of conductivity, which extends into the epitaxial region from the front surface, and delimiting an internal region. The optoelectronic integrated device moreover includes a MOSFET including at least one body region having the second type of conductivity, which contacts the ring region and extends at least in part into the internal region from the front surface. A photodetector includes a photodetector region having the second type of conductivity, and extends into the semiconductor body starting from the front surface, contacting the ring region.

24 Claims, 14 Drawing Sheets

OPTOELECTRONIC INTEGRATED DEVICE INCLUDING A PHOTODETECTOR AND A MOSFET TRANSISTOR, AND MANUFACTURING PROCESS THEREOF

FIELD OF THE INVENTION

The present invention relates to an optoelectronic integrated device, which includes a photodetector and a MOSFET (metal-oxide-semiconductor field-effect transistor), as well as to the corresponding manufacturing process. In particular, the present optoelectronic integrated device is suitable for applications of the so-called "zero-power standby mode" type.

BACKGROUND

As is known, many electrical or electronic appliances, such as for example television sets and radios, envisage a low-consumption operating mode, the so-called "standby" mode. In this mode, the electrical appliance is inactive with respective to the normal operating mode (for example, in the case of a television set, the mode whereby images are displayed), but can be turned on and off remotely, using a remote control. An electrical appliance in standby mode is in any case supplied by the electric grid (or battery) and consumes energy. The energy consumption is due to the presence of a microcontroller and of a sensor connected to the microcontroller, which are configured for receiving and processing commands supplied remotely via a remote control, and for this purpose are supplied.

FIG. 1 shows a portion of an electrical appliance 1, which comprises a supply circuit 4 designed to guarantee operation in standby mode of a microcontroller 5, to which it is connected, and of a sensor 6, connected to the microcontroller 5. The supply circuit 4 is a so-called "switch-mode power supply" (SMPS).

The electrical appliance 1 comprises a supply port 2, connected, for example, to the electric grid or to a battery (not illustrated), and receiving at an input a supply voltage $V_{AL}$. The supply voltage $V_{AL}$ is then supplied at an input to the supply circuit 4, which supplies the microcontroller 5 both during the normal operating mode and during the standby operating mode. In particular, during the standby mode, the microcontroller 5 will be on and able to process any possible commands (for example, the command for switching on the electrical appliance 1) issued remotely using a remote control 7 and detected by the sensor 6. The electrical appliance 1 may further comprise a supply switch 8, arranged between the supply port 2 and the supply circuit 4, and configured so as to operate in conduction or in inhibition. The switch 8 may be, for example, a general switch of the electrical appliance 1. If the supply switch 8 operates in conduction, during the standby mode the supply circuit 4 and the microcontroller 5 are supplied. Instead, if the supply switch 8 operates in inhibition, the supply circuit 4 and the microcontroller 5 are not supplied, and the standby mode cannot be activated. In the latter case, the electrical appliance 1 is off and cannot be turned on remotely using the remote control 7.

Detailed examples of circuits that implement the supply circuit 4 are described in WO2010/106113. In particular, a supply circuit is described, which comprises a phototransistor and a MOSFET, which are connected in such a way that, in the presence of an electromagnetic signal incident on the phototransistor, the latter generates a photocurrent that biases the MOSFET in such a way as to drive it into conduction. Furthermore, the supply circuit is such that, when the MOSFET is in conduction, a transfer of electric power takes place from the supply port 2 to the microcontroller 5. In practice, the phototransistor and the MOSFET form an electro-optical relay.

In general, in the sector of applications of the so-called "zero-power standby" type, the photodetectors used within electro-optical relays need to withstand very high voltages, such as, for example, voltages higher than 400 V. Likewise, also the MOSFETs used in these applications should be able to sustain very high voltages. For this purpose, currently phototransistors and transistors of a discrete type are adopted, with consequent increase in the overall dimensions of the supply circuits.

SUMMARY

An object of the present invention is to provide an optoelectronic integrated device that will overcome at least in part the drawbacks of the known art.

According to the present invention an optoelectronic integrated device, an electro-optical circuit, and a manufacturing process are provided.

The optoelectronic integrated device includes a body made of semiconductor material, which is delimited by a front surface and includes a substrate having a first type of conductivity, an epitaxial region, which has the first type of conductivity and forms the front surface, and a ring region having a second type of conductivity, which extends into the epitaxial region from the front surface, and delimiting an internal region. The optoelectronic integrated device, moreover, includes a MOSFET including at least one body region having the second type of conductivity, which contacts the ring region and extends at least in part into the internal region from the front surface. A photodetector includes a photodetector region having the second type of conductivity, and extends into the semiconductor body starting from the front surface, contacting the ring region.

BRIEF DESCRIPTION OF THE DRAWINGS

For a better understanding of the present invention preferred embodiments are now described, purely by way of non-limiting example, with reference to the attached drawings, wherein.

DETAILED DESCRIPTION OF THE EMBODIMENTS

Figure 1:
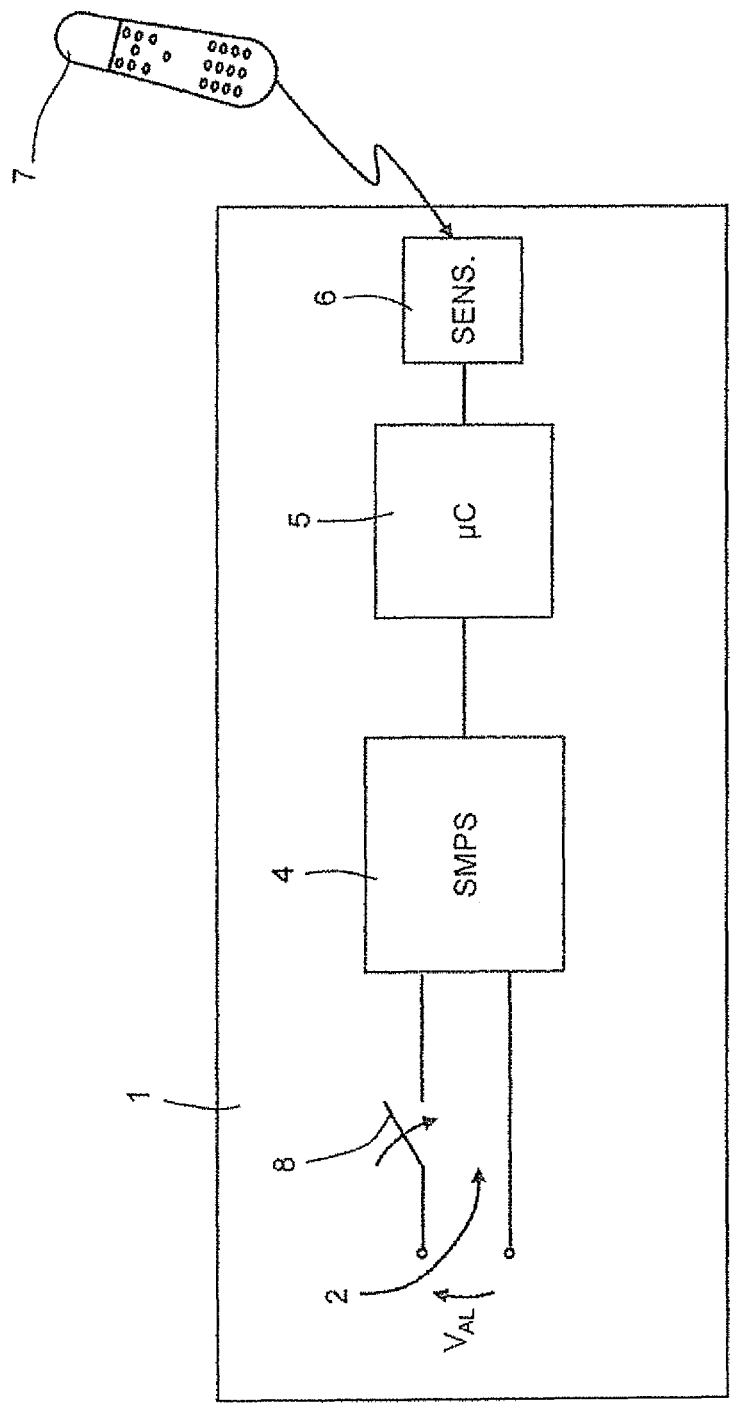
FIG. 1 is a block diagram of a circuit of a known type for an application of the "zero-power standby" type.
Figure 2:
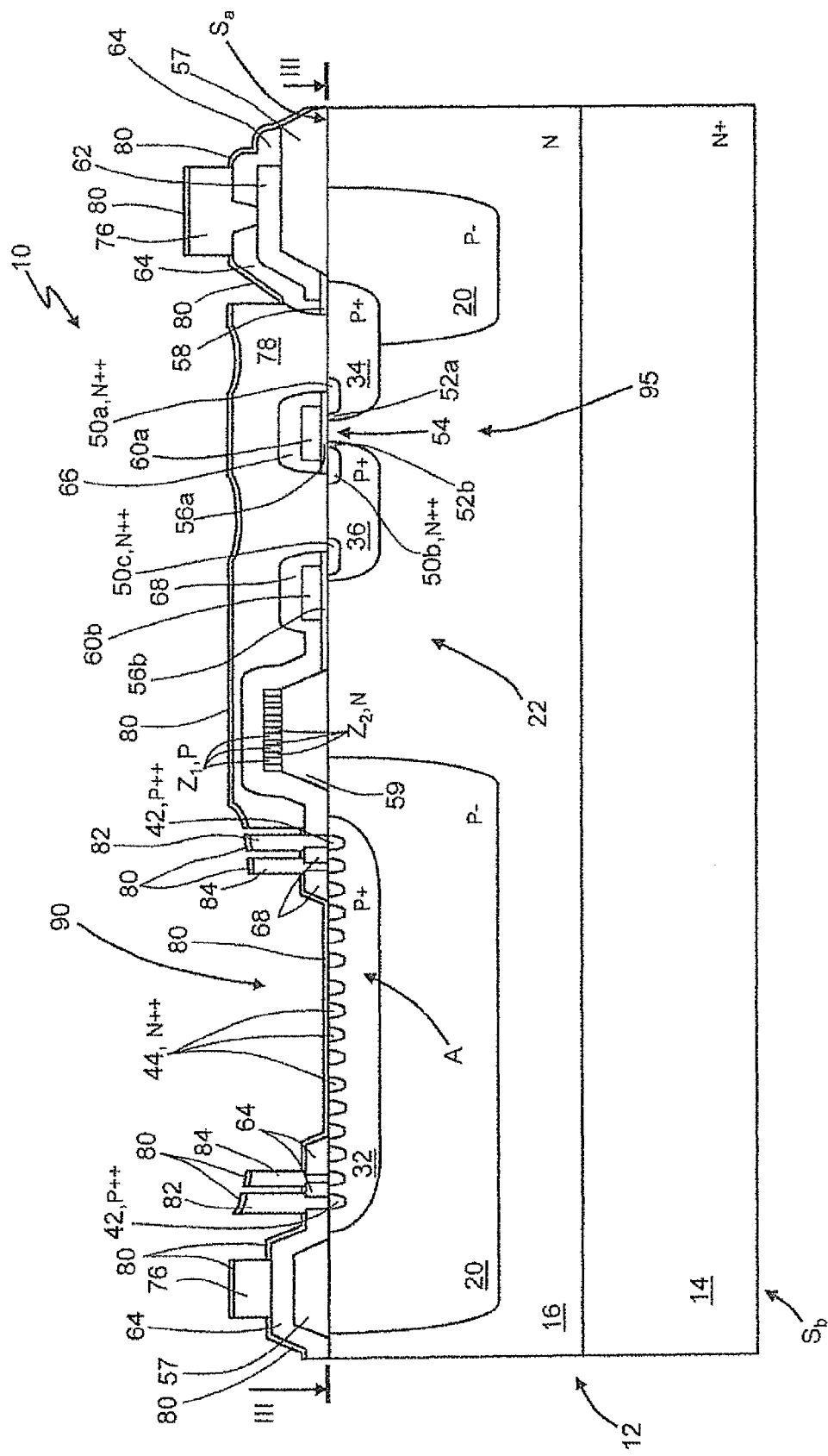
FIGS. 2, 6, 8, and 10-13 are schematic cross sections of embodiments of the present optoelectronic integrated device.

FIG. 2 shows an optoelectronic integrated device 10, which will be referred to hereinafter as "optoelectronic device 10". The optoelectronic device 10 comprises a body 12 of semiconductor material (for example, silicon), which is delimited by a top surface $S_a$, which will also be referred to as "front surface $S_a$", and by a bottom surface $S_b$. The body 12 comprises a substrate 14 of an N+ type (for example, doped with phosphorus) having a thickness comprised, for example, between 200 μm and 500 μm, and a doping level of approximately $10^{20}$ cm$^{-3}$. In addition, the body 12 comprises an epitaxial layer 16 of an N type, which overlies the substrate 14, with which it is in direct contact, and has a thickness comprised, for example, between 20 μm and 200 μm, and a doping level comprised between $5 \cdot 10^{13}$ cm$^{-3}$ and $5 \cdot 10^{16}$ cm$^{-3}$.

Figure 3:
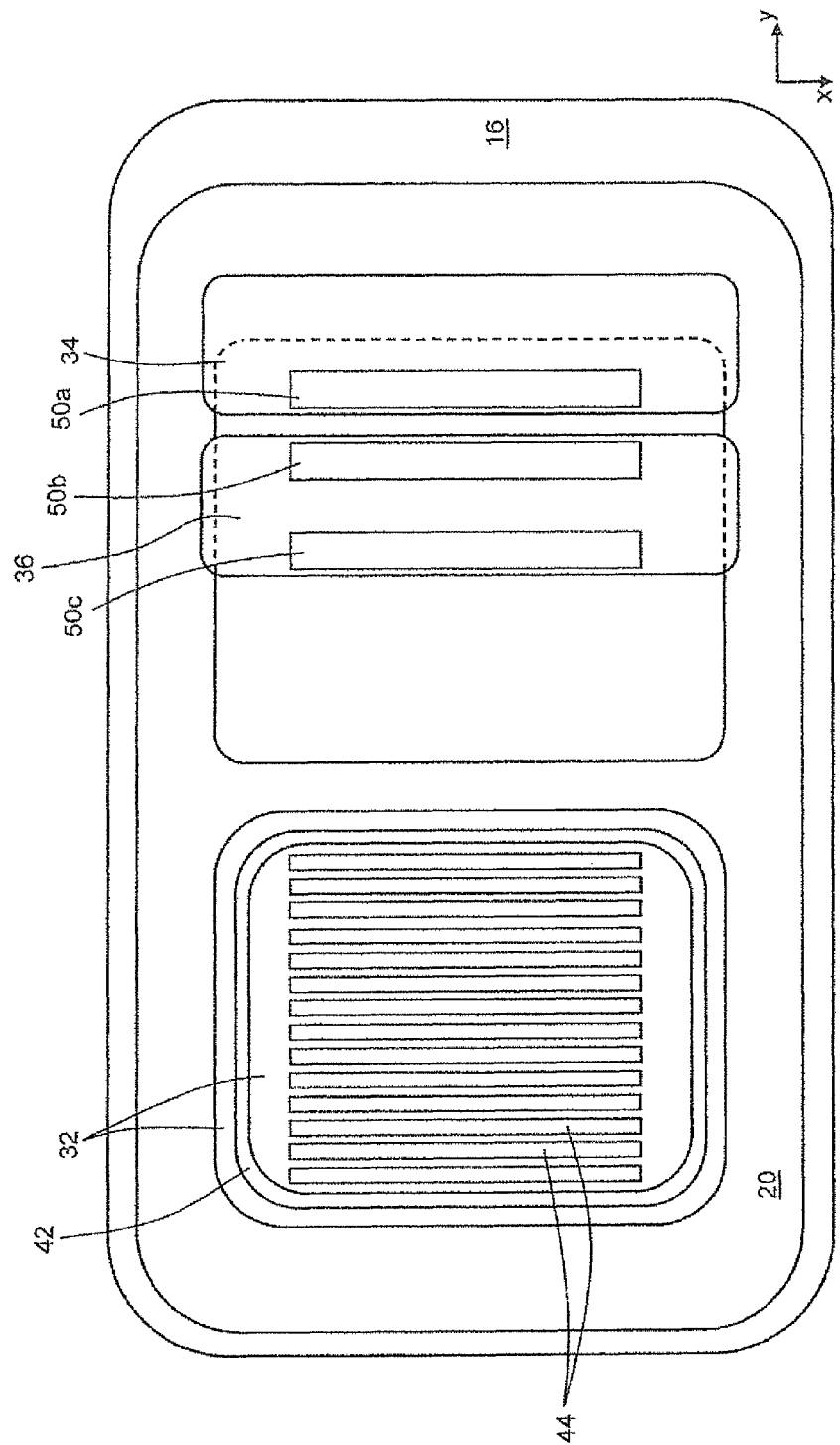
FIG. 3 is a schematic top plan view of a section of the embodiment illustrated in FIG. 2, taken along a line of section designated by in FIG. 2.
Figure 4:
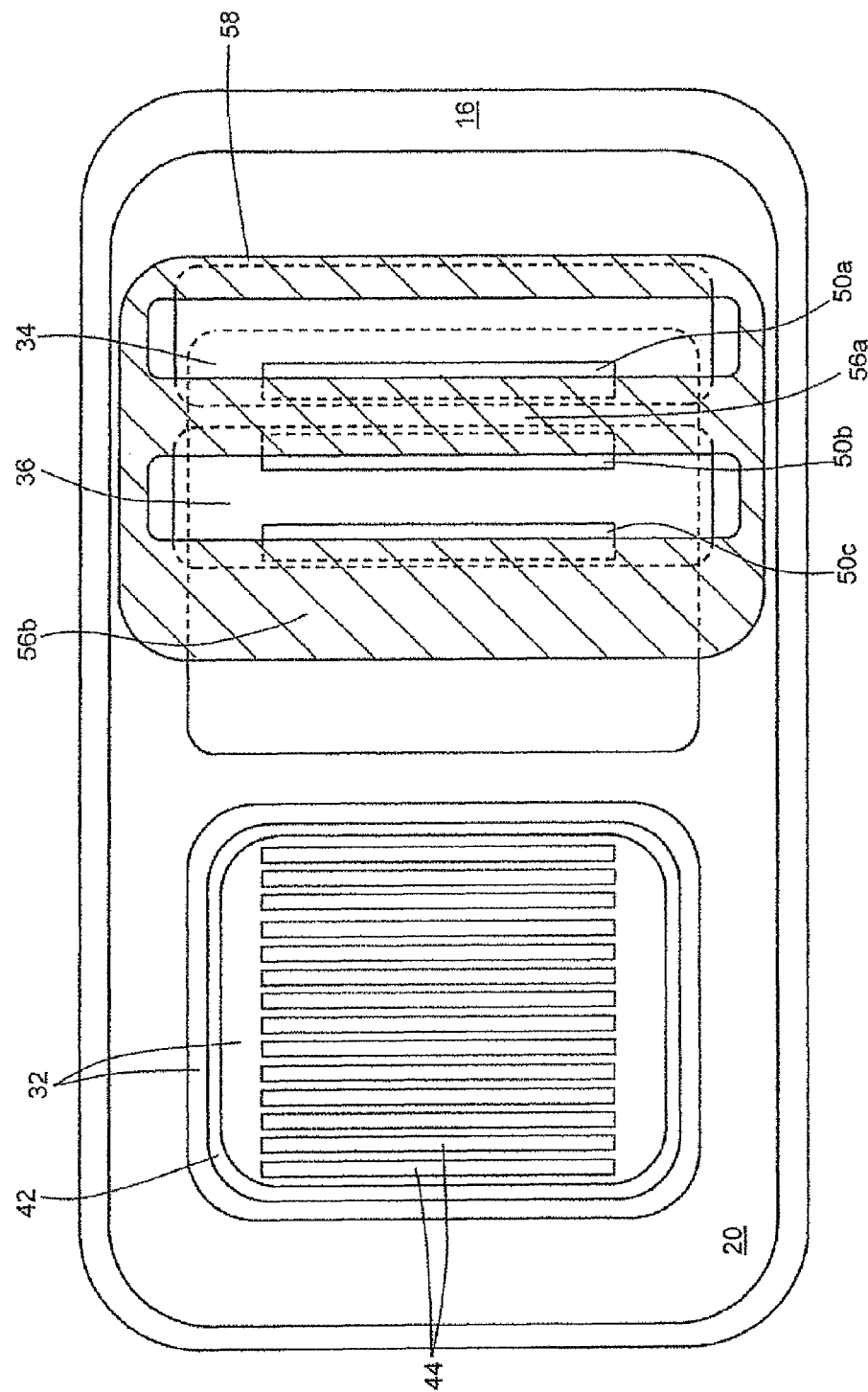
FIG. 4 is a schematic top plan view with portions removed of the embodiment illustrated in FIG. 2.

The body 12 further comprises a ring region 20 of a P− type, which extends into the epitaxial layer 16 and delimits laterally an internal region 22, which is formed by a portion of the epitaxial layer 16. In particular, as illustrated in FIGS. 3 and 4, the ring region 20 has an annular shape. Hence, in the top plan view, it has the shape of a complex connected surface, which surrounds a simply connected surface, formed by the internal region 22. Furthermore, without this implying any loss of generality, in the embodiment illustrated in FIG. 2, the ring region 20 is formed by a single well and has a depth comprised, for example, between 2 μm and 40 μm, and a doping level for example of approximately $5 \cdot 10^{14}$ cm$^{-3}$.

The body 12 further comprises a first base region 32 and one or more body regions, which, as on the other hand also the first base region 32, extend starting from the top surface $S_a$. For example, in the embodiment illustrated in FIG. 2, a first body region 34 and a second body region 36 are present, purely by way of example. In any case, embodiments with a greater number of body regions are possible. Each of the first base region 32 and the first and second body regions 34, 36 is of a P+ type, has a depth comprised, for example, between 0.5 μm and 10 μm, and a doping level of, for example, $10^{16}$ cm$^{-3}$. In detail, each of the first and second body regions 34, 36 has an elongated shape, in top plan view. In particular, the first and second body regions 34, 36 are elongated in a direction X, to which they are parallel, and are moreover aligned in a direction Y perpendicular to the direction X. Without this implying any loss of generality, also the first base region 32 is aligned to the first body region 34 and to the second body region 36 in the direction Y.

In greater detail, the first base region 32 extends into the ring region 20 so as to be surrounded at the bottom by the ring region 20, with which it is in direct contact. Furthermore, the first base region 32 has, in top plan view, a simply connected shape and is entirely surrounded laterally by the ring region 20. Consequently, the first base region 32 does not contact the epitaxial layer 16.

The first body region 34 extends on the edge of the internal region 22. In particular, a first portion of the first body region 34 extends into the internal region 22, with which it is in direct contact, whereas a second portion extends into the ring region 20, with which it is in direct contact. The second body region 36 extends into the internal region 22 and is arranged between the first base region 32 and the first body region 34, being set apart from these laterally. Furthermore, as illustrated in FIG. 3, the second body region 36 is connected to the ring region 20, at its own ends.

The body 12 further comprises a first enriched base region 42, which is of a P++ type, has a thickness comprised, for example, between 0.2 μm and 3 μm and has a doping level for example of $10^{19}$ cm$^{-3}$. The first enriched base region 42 extends into the first base region 32, with which it is in direct contact, starting from the top surface $S_a$. Furthermore, the first enriched base region 42 has, in top plan view, a ring shape; consequently, the first enriched base region 42 delimits laterally a portion of the first base region 32.

The body 12 further comprises a plurality of first emitter regions 44 of an N++ type, with a thickness comprised, for example, between 0.2 μm and 1 μm and with a doping level for example of $10^{20}$ cm$^{-3}$. The first emitter regions 44 extend into the portion of the first base region 32 delimited by the first enriched base region 42, by which they are surrounded, at a distance. In addition, in top plan view, the first emitter regions 44 have shapes elongated in the direction X and are arranged parallel to one another, as well as parallel to the first and second body regions 34, 36. In addition, the first emitter regions 44 are aligned in the direction Y. In practice, the shape of the first emitter regions 44 enables increase in the contact surface between the first emitter regions 44 themselves and the first base region 32, given the same overall dimensions.

The body 12 further comprises a plurality of source regions of an N++ type, which have a thickness comprised, for example, between 0.2 μm and 1 μm, and a doping level for example of $10^{20}$ cm$^{-3}$. Purely by way of example, in the embodiment illustrated in FIG. 2, a first source region, a second source region, and a third source region are present, designated, respectively, by 50a, 50b, and 50c and laterally set apart from one another. The first, second, and third source regions 50a-50c extend from the top surface $S_a$ and have, in top plan view, shapes elongated in the direction X. The first, second, and third source regions 50a-50c are hence parallel to one another and to the first and second body regions 34, 36; moreover, the first, second, and third source regions 50a-50c are aligned in the direction Y.

In detail, the first, second, and third source regions 50a-50c are arranged in succession, starting from the edge of the internal region 22, towards the inside. In particular, the first source region 50a extends into the first body region 34, with which it is in direct contact, and by which it is surrounded laterally and at the bottom. The second and third source regions 50b, 50c extend, instead, inside the second body region 36, with which they are in direct contact, and by which they are surrounded laterally and at the bottom. Furthermore, the first, second, and third source regions 50a-50c overly the internal region 22, without contacting it directly, on account of the interposition of the first and second body regions 34, 36. In addition, the first, second, and third source regions 50a-50c do not contact the ring region 20.

In greater detail, extending between the first and second source regions 50a, 50b are portions of the first and second body regions 34, 36, which will be referred to hereinafter as "first and second channel portions 52a, 52b", as well as a portion of the internal region 22, which will be referred to hereinafter as "separation portion 54".

The optoelectronic device 10 further comprises a dielectric edge region 57, which has an annular shape and extends over the top surface $S_a$ so as to contact directly the ring region 20 and surround, in top plan view, the first base region 32 and the first and second body regions 34, 36. In top plan view, the dielectric edge region 57 is hence set on the outside of the first enriched base region 42 and of the first emitter regions 44. The optoelectronic device 10 further comprises an internal dielectric region 59, which has an elongated shape, in top plan view, and extends over the top surface $S_a$. In particular, the internal dielectric region 59 is connected, at its own two ends, to the dielectric edge region 57. Even more in particular, the internal dielectric region 59 is arranged in such a way that, in top plan view, it is arranged between the first base region 32 and the second body region 36. Furthermore, without this implying any loss of generality, the internal dielectric region 59 forms, together with the dielectric edge region 57, a single bottom insulating region, made, for example, of thermal oxide.

The optoelectronic device 10 further comprises a first gate-oxide region 56a and a second gate-oxide region 56b, which are made of thermal oxide and have, in top plan view, shapes elongated in the direction X. In addition to being parallel to one another, the first and second gate-oxide regions 56a, 56b are aligned in the direction Y. The first gate-oxide region 56a overlies the first and second channel portions 52a, 52b, as well as the separation portion 54, being in direct contact with these. Furthermore, the first gate-oxide region 56a overlies partially both the first source region 50a and the second source region 50b, being in direct contact with these.

The second gate-oxide region 56b overlies a top portion of the internal region 22 and a portion of the second body region 36, being in direct contact with these. Furthermore, the second gate-oxide region 56b partially overlies the third source region 50c, with which it is in direct contact, and is connected laterally with the internal dielectric region 59.

The optoelectronic device 10 further comprises a first side region 58, which is made of thermal oxide and extends over part of the ring region 20 and part of the first body region 34, being in direct contact with these. In detail, the first side region 58 contacts laterally the dielectric edge region 57, which is arranged externally with respect to the first side region 58. Furthermore, the first side region 58 is arranged externally, in top plan view, with respect to the internal region 22. In greater detail, the first side region 58 has a shape such that each between the first and second gate-oxide regions 56a, 56b is connected, at the respective ends, to the first side region 58. Without this implying any loss of generality, the first and second gate-oxide regions 56a, 56b form, together with the first side region 58, a single oxide region, which is laterally set apart from the first base region 32. In any case possible are embodiments comprising a greater number of gate-oxide regions.

The optoelectronic device 10 further comprises a first conductive region 60a and a second conductive region 60b, which are made, for example, of polysilicon. In top plan view, the first and second conductive regions 60a, 60b have shapes elongated in the direction X; moreover, the first and second conductive regions 60a, 60b overly, respectively, the first and second gate-oxide regions 56a, 56b, with which they are in direct contact. Embodiments are in any case possible comprising a greater number of conductive regions.

The optoelectronic device 10 further comprises a second side region 62, which is made, for example, of polysilicon and extends over the first side region 58 and the dielectric edge region 57, being in direct contact with these. In addition, the second side region 62 is arranged in such a way that each between the first and second conductive regions 60a, 60b radiuses, at the respective ends, to the second side region 62. Without this implying any loss of generality, the first and second conductive regions 60a, 60b form, together with the second side region 62, a single conductive region, which is laterally set apart from the first base region 32.

The optoelectronic device 10 further comprises a plurality of first diode regions $Z_1$ and a plurality of second diode regions $Z_2$, which have shapes elongated in the direction X and are arranged on top of the internal dielectric region 59. In particular, the first diode regions $Z_1$ are made of semiconductor (for example, silicon) and are of a P type. The second diode regions $Z_2$ are made of semiconductor (for example, silicon) and are of an N type. Furthermore, the first and second diode regions $Z_1$, $Z_2$ are coplanar and are parallel to one another. In addition, the first and second diode regions $Z_1$, $Z_2$ are arranged so as to form an alternating succession of elements, for example in a direction parallel to the direction X, and in which adjacent elements are in contact with one another.

The optoelectronic device 10 further comprises a first top dielectric region 64, which extends over the dielectric edge region 57 and the first and second side regions 58, 62, with which it is in direct contact. Furthermore, the first top dielectric region 64 has an annular shape and surrounds, in top plan view, the first emitter regions 44 and the first, second, and third source regions 50a-50c. Without this implying any loss of generality, in the embodiment illustrated in FIG. 2, the first top dielectric region 64 partially overlies the first base region 32. In greater detail, the first top dielectric region 64 surrounds laterally the second side region 62, but is separated from the first and second body regions 34, 36, as well as from the first, second, and third source regions 50a-50c.

The optoelectronic device 10 further comprises a second top dielectric region 66 and a third top dielectric region 68, which overly, respectively, the first and second conductive regions 60a, 60b, with which they are in direct contact. In particular, the second top dielectric region 66 surrounds laterally the first conductive region 60a and overlies the first gate-oxide region 56a, with which it is in direct contact. The second top dielectric region 66 also overlies, at a distance, the first and second source regions 50a, 50b, the first gate-oxide region 56a being arranged between the second top dielectric region 66 and the first and second source regions 50a, 50b.

The third top dielectric region 68 surrounds laterally the second conductive region 60b and overlies the second gate-oxide region 56b, with which it is in direct contact. The third top dielectric region 68 also overlies, at a distance, the third source region 50c, the second gate-oxide region 56b being arranged between the third top dielectric region 68 and the third source region 50c. The third top dielectric region 68 also overlies, in direct contact, the internal dielectric region 59 and the first and second diode regions $Z_1$, $Z_2$. Without this implying any loss of generality, in the embodiment illustrated in FIG. 2, the third top dielectric region 68 also overlies part of the ring region 20 and part of the first base region 32.

The second and third top dielectric regions 66, 68 are connected to the first top dielectric region 64, by which they are surrounded. Furthermore, without this implying any loss of generality, the first, second, and third top dielectric regions 64, 66, 68 are formed by deposited oxide and form a single top insulating region.

The optoelectronic device 10 further comprises an edge metallization 76, which extends over, and through, the first top dielectric region 64, so as to overly, at a distance, the ring region 20. Consequently, the edge metallization 76 has an annular shape and surrounds, in top plan view, the first base region 32 and the first and second body regions 34, 36. Furthermore, the edge metallization 76 contacts the second side region 62 and the first and second conductive regions 60a, 60b (the latter two contacts are not illustrated in FIG. 2).

The optoelectronic device 10 further comprises a source metallization 78, which extends over the second and third top dielectric regions 66, 68 and contacts the first, second, and third source regions 50a-50c. Furthermore, without this implying any loss of generality, in the embodiment illustrated in FIG. 2, the source metallization 78 contacts the first side region 58 and the first top dielectric region 64.

The optoelectronic device 10 further comprises an antireflection layer 80, which overlies, in direct contact, a (possibly, complete) subset of the first emitter regions 44, as well as the corresponding portions of the first base region 32 arranged between these first emitter regions 44. The first emitter regions in contact with the antireflection layer 80 and the portions of the first base region 32 arranged between them form an active area A. As illustrated by way of example in FIG. 2, the antireflection layer 80 may, moreover, extend over the first top dielectric region 64, as well as the edge metallization 76 and source metallization 78 even though this characteristic may be irrelevant for the purposes of the present embodiments.

The antireflection layer 80 is made of dielectric material (oxide or nitride) and has a thickness equal to $\lambda/(4n)$, where n is the refractive index of the material that forms the antireflection layer 80, and $\lambda$ is the wavelength of an expected radiation, described hereinafter. Purely by way of example, in the case of applications in the industrial field, the wavelength $\lambda$ may be comprised, for example, between 450 nm and 650 nm; instead, in the case of applications in the field of consumer electronics, the wavelength $\lambda$ may be comprised between 800 nm and 900 nm. In what follows, the wavelength $\lambda$ will be referred to as "operating wavelength".

The optoelectronic device 10 further comprises a first base metallization 82, which traverses the first and third top dielectric regions 64, 68 and directly contacts the first enriched base region 42. The first base metallization 82 does not overlie the active area A; i.e., it is laterally set apart from the active area A; moreover, the first base metallization 82 is optional and may be left floating.

In addition, the optoelectronic device 10 comprises a first emitter metallization 84, which contacts the first emitter regions 44, without overlying them completely. In particular, the first emitter metallization 84 traverses the first and third top dielectric regions 64, 68, but does not extend over the active area A. This being said, for practical purposes, the first emitter regions 44 and the first base region 32 form, respectively, the emitter and the base of a phototransistor 90, the collector of which is formed by the substrate 14. In other words, the first emitter regions 44, the first base region 32, and the substrate 14 form, respectively, a first conduction electrode, a control electrode, and a second conduction electrode of the phototransistor 90.

The first and second conductive regions 60a, 60b form the gate electrode of a MOSFET 95, which is moreover formed by the first and second gate-oxide regions 56a, 56b, by the first, second, and third source regions 50a-50c, and by the first and second body regions 34, 36. The source electrode of the MOSFET 95 is formed by the first, second, and third source regions 50a-50d, whereas the drain electrode is formed by the substrate 14. Furthermore, the edge metallization 76 functions as field plate for increasing the voltage strength of the MOSFET 95; i.e., it has the purpose of deflecting the field lines. A drain metallization (not illustrated) may be formed underneath the substrate 14.

The MOSFET 95 is a power transistor; i.e., it is designed to sustain high voltages between its own drain and source electrodes. In other words, the MOSFET 95 is characterized by a high breakdown voltage. The high breakdown voltage is obtained due to the use of the ring region 20, which prevents premature onset of breakdown in the portions of the body regions having greater curvature. In addition, a further increase in the breakdown voltage is obtained thanks to the fact that the dielectric edge region 57 and the edge metallization 76 form an edge structure, which, in use, prevents concentration of the electrical field lines on the edge structure itself.

In greater detail, the MOSFET 95 is characterized in that the channel is formed, in use, within the first and second channel portions 52a, 52b, as well as within a portion of the second body region 36 underlying the second gate-oxide region 56b. Consequently, within the MOSFET 95, the channel as a whole has a large width, and the current flows vertically. Furthermore, the MOSFET 95 is formed by two cells, each of which forms a VDMOS (Vertical Diffused MOS) transistor. In particular, the first cell is formed, amongst other things, by the first gate-oxide region 56a and by the first and second source regions 50a, 50b, whereas the second cell is formed, amongst other things, by the second gate-oxide region 56b and by the third source region 50c. Various embodiments are in any case possible, where the MOSFET 95 is formed by a single VDMOS transistor, or else where the number of cells is greater than two.

Figure 5:
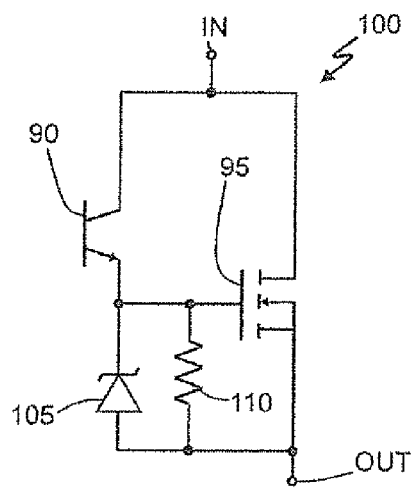
FIGS. 5, 7, 9, and 14-15 are circuit diagrams of electro-optical circuits including the present optoelectronic device.

The optoelectronic device 10 can be used to form a first electro-optical circuit 100 illustrated in FIG. 5. The first electro-optical circuit 100 comprises an input terminal IN and an output terminal OUT. Moreover, the first electro-optical circuit 100 comprises the phototransistor 90, the MOSFET 95, and a Zener diode 105, which is formed by the first and second diode regions $Z_1$, $Z_2$.

The collector of the phototransistor 90 is connected to the input terminal IN, whilst the emitter is connected to the gate electrode of the MOSFET 95; the base of the phototransistor 90 is, instead, floating, as mentioned previously. The drain electrode and the source electrode of the MOSFET 95 are instead connected, respectively, to the input terminal IN and to the output terminal OUT. As regards the Zener diode 105, the cathode is connected to the emitter of the phototransistor 90 and hence also to the gate electrode of the MOSFET 95; the anode is connected to the output terminal OUT. The electrical connections between the phototransistor 90, the MOSFET 95, and the Zener diode 105 may be formed in a way in itself known, with one or more connection metallizations, which may be integrated in the optoelectronic device 10.

The first electro-optical circuit 100 further comprises a first resistor 110, the two terminals of which are connected, respectively, to the gate electrode of the MOSFET 95 and to the output terminal OUT. For example, the first resistor 110 may have a resistance comprised between 100 k$\Omega$ and 10 M$\Omega$. Moreover, the first resistor 110 may be integrated, in a way in itself known, within the optoelectronic device 10, or else may be of a discrete type.

Operatively, the input terminal IN is designed to be connected to a supply voltage, whereas the output terminal OUT is designed to be connected to a load. In this way, the voltage present on the drain of the MOSFET 95 biases the collector of the phototransistor 90. Consequently, assuming that radiation is generated, for example with a remote control, at the operating wavelength $\lambda$, and that the radiation is directed in such a way that, after passing through the antireflection layer 80, it penetrates into the active area A, on the emitter of the phototransistor 90 a photocurrent is generated, i.e., a current caused by the incident radiation.

The photocurrent flows through the first resistor 110, with consequent generation of a switching-on voltage across the first resistor 110. If the photocurrent is higher than a limit value, the switching-on voltage is higher than the threshold voltage of the MOSFET 95, and hence drives the MOSFET 95, which was previously inhibited, into conduction.

There consequently takes place a flow of current from the input terminal IN towards the output terminal OUT, through the MOSFET 95. In other words, the radiation that impinges on the phototransistor 90 drives switching of the first electro-optical circuit 100 from a state of inhibition to a state of conduction. The Zener diode 105 protects the gate electrode of the MOSFET 95, and hence the first and second gate-oxide regions 56a, 56b, from overvoltages. Furthermore, the first resistor 110, in addition to biasing the gate electrode of the MOSFET 95, decreases the time of discharge of this gate electrode, in a subsequent switching-off step, where the radiation no longer impinges upon the phototransistor 90.

In greater detail, the antireflection layer 80 performs the function of maximizing the fraction of radiation that penetrates within the active area A, and hence concurs in increasing the photocurrent. Furthermore, given the same incident radiation, the intensity of the photocurrent generated by the phototransistor 90 is proportional to the gain $h_{fe}$ of the phototransistor 90. In fact, when the active area A is illuminated by the radiation, there is an absorption of the photons within the depleted region of the base-collector junction, with consequent generation of electrons, which are injected into the base; the current thus produced is subsequently amplified by the phototransistor 90, the gain being, as has been said, equal to $h_{fe}$. In this connection, the presence of the ring region 20 underneath the first base region 32 makes it possible to set the base-collector junction at a greater depth, with consequent increase in the responsivity of the phototransistor 90 at wavelengths close to the infrared.

Regarding, moreover, the mutual arrangement of the first base region 32 and of the ring region 20, it moreover prevents the so-called "punch-through" of the phototransistor 90, i.e., the contact between the depleted regions that extend, respectively, through the base-emitter junction and the base-collector junction.

According to a different embodiment (illustrated in FIG. 6), the optoelectronic device 10 further comprises a second base region 120, which extends starting from the top surface $S_a$, within the ring region 20, so as to be surrounded at the bottom and laterally by the ring region 20. The second base region 120 is separate from the first base region 32, is of a P+ type and has, for example, the same thickness and doping level as the first base region 32.

The optoelectronic device 10 further comprises a plurality of second emitter regions 124 of an N++ type, which have an elongated shape and are parallel to the first emitter regions 44. The second emitter regions 124 extend into the second base region 120, starting from the top surface $S_a$ and so as to be surrounded at the bottom and laterally by the second base region 120. For example, the second emitter regions 124 have the same thickness and the same doping level as the first emitter regions 44.

The optoelectronic device 10 further comprises a plurality of second enriched base regions 122 of a P++ type, which have an elongated shape and extend into the second base region 120, starting from the top surface $S_a$ and so as to be surrounded at the bottom and laterally by the second base region 120. Furthermore, the second enriched base regions 122 are parallel to the second emitter regions 124 and alternate, at regular intervals apart, with these latter. For example, the second enriched base regions 122 have the same thickness and the same doping level as the first enriched base region 42.

The optoelectronic device 10 further comprises a second base metallization 132, which is connected to the second enriched base regions 122, and a second emitter metallization 134, which is connected to the second emitter regions 124. In greater detail, the second base metallization 132 and the second emitter metallization 134 extend through the third top dielectric region 68. Furthermore, the second base metallization 132 overlies the second enriched base regions 122, and the second emitter metallization 134 overlies the second emitter regions 124, in such a way that access to the second enriched base regions 122 and to the second emitter regions 124 by the electromagnetic radiation is prevented. In fact, the second base metallization 132 and the second emitter metallization 134 function as electromagnetic shields and perform the function of preventing onset, within the optoelectronic device 10, of spurious photocurrents.

In practice, the second base region 120 and the second emitter regions 124 form, respectively, the base and the emitter of a bipolar transistor 135, the collector of which is formed by the substrate 14, and is hence shared with the phototransistor 90. In other words, the second base region 120, the second emitter regions 124, and the substrate 14 form, respectively, a control electrode and a first conduction electrode and a second conduction electrode of the bipolar transistor 135. The bipolar transistor 135 and the phototransistor 90 hence form an optoelectronic circuit connected in Darlington configuration.

Figure 7:
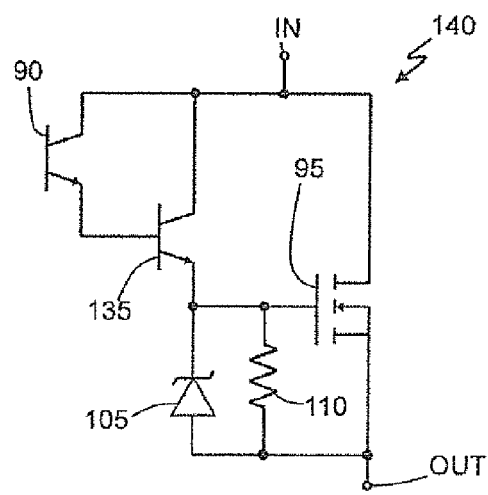
Figure 6:
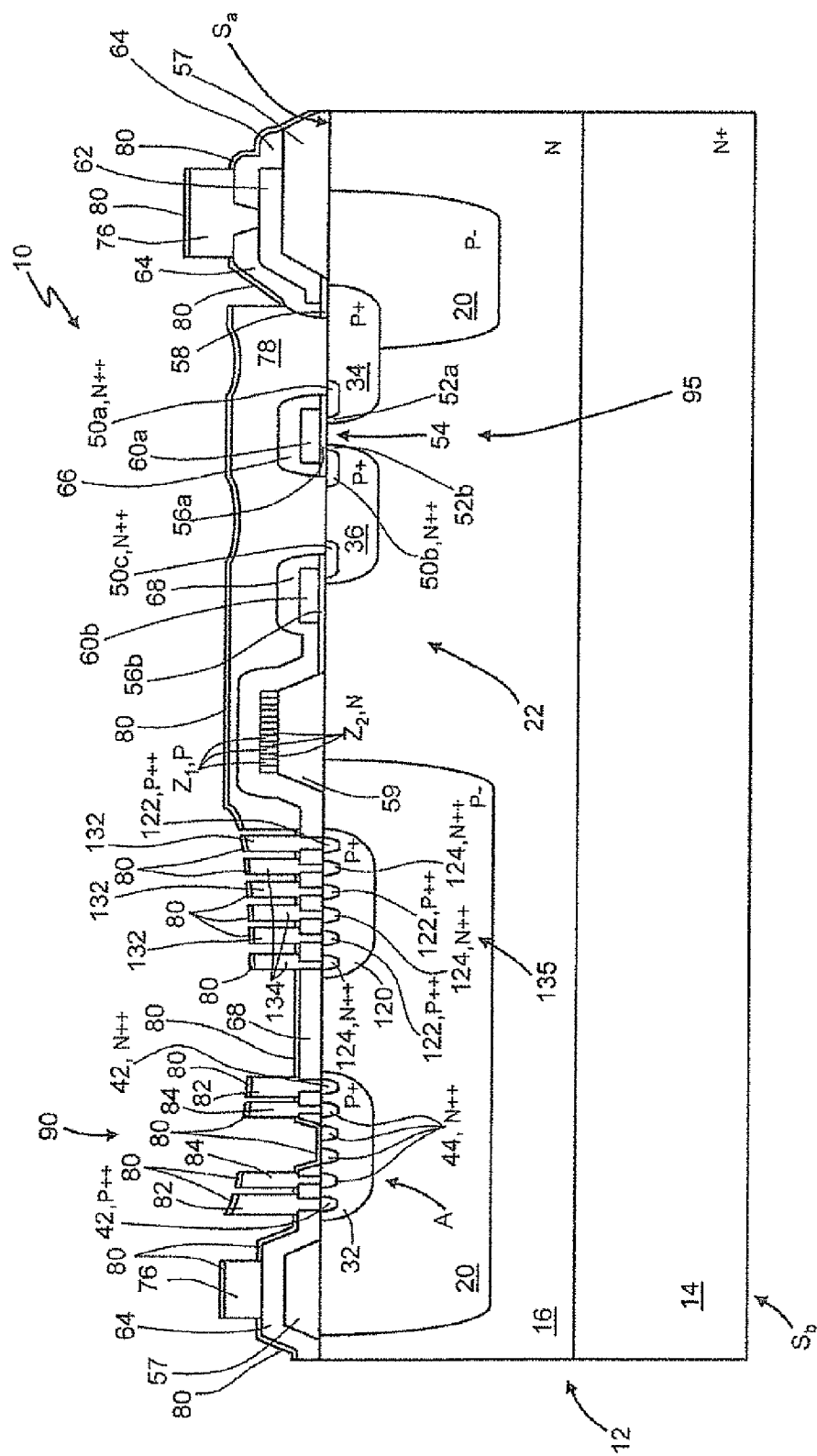

It should be noted that in FIG. 6 as, on the other hand, also in some of the subsequent figures, a smaller number of first emitter regions 44 is shown as compared to what is illustrated in FIG. 2, only for reasons of convenience of graphic illustration. By adopting the embodiment illustrated in FIG. 6, it is possible to form a second electro-optical circuit 140, illustrated in FIG. 7 and described in what follows with reference just to the differences from the first electro-optical circuit 100.

As mentioned previously, the collector of the phototransistor 90 and the collector of the bipolar transistor 135 are connected together as well as to the input terminal IN. The emitter of the phototransistor 90 is connected to the base of the bipolar transistor 135, the emitter of which is connected to the gate electrode of the MOSFET 95, and hence is also connected to the cathode of the Zener diode 105 and to the first resistor 110.

Operation of the second electro-optical circuit 140 is similar to operation of the first electro-optical circuit 100; however, it is characterized by a higher sensitivity, since the photocurrent present on the emitter of the phototransistor 90 is amplified by the bipolar transistor 135. To drive the MOSFET 95 into conduction it is hence sufficient for radiation to impinge on the phototransistor 90 with an intensity lower than in the case of the first electro-optical circuit 100.

Figure 8:
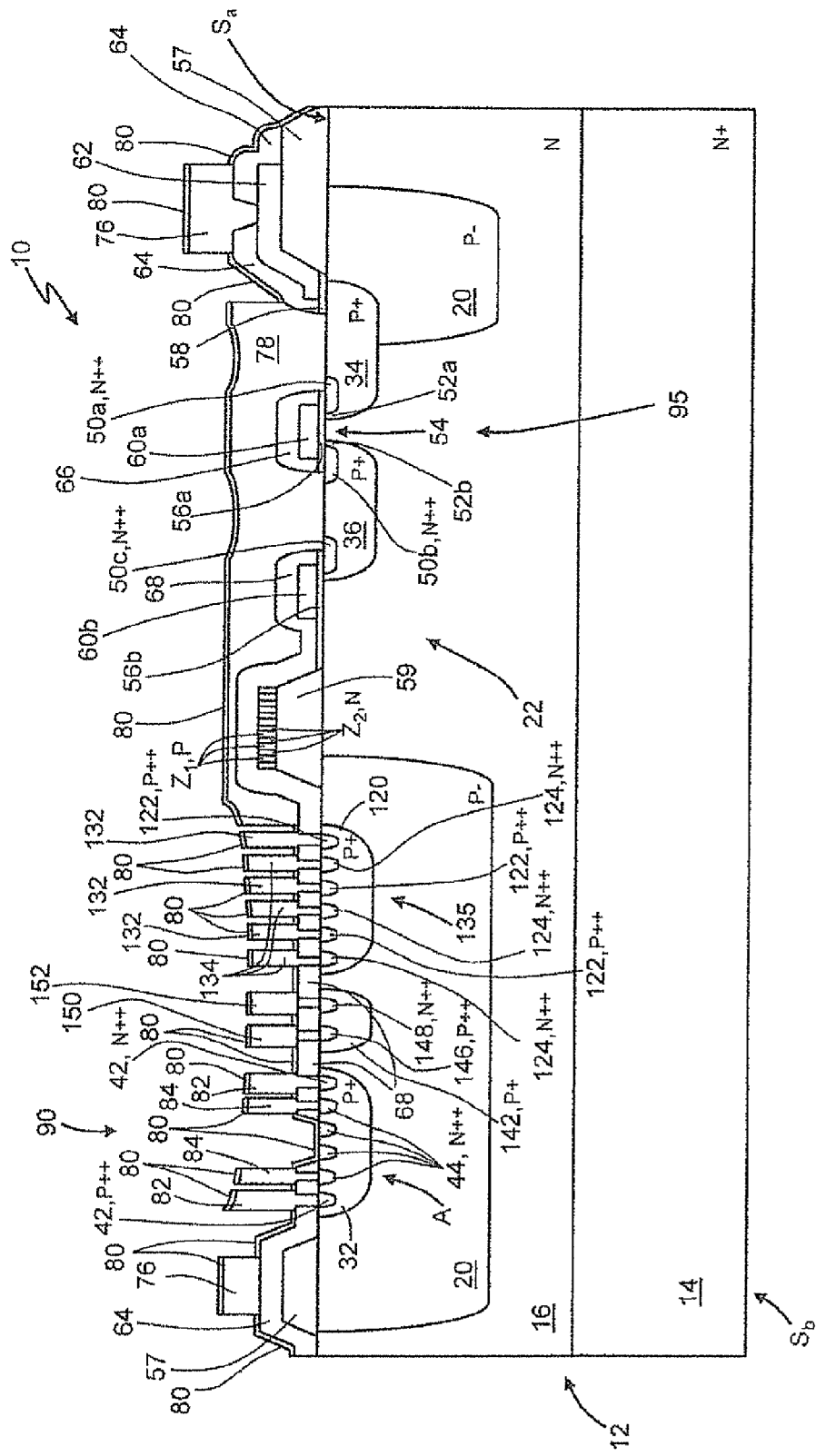

As illustrated in FIG. 8, according to a different embodiment, described with reference to the differences from the embodiment illustrated in FIG. 6, the optoelectronic device 10 further comprises a diode region 142 of a P+ type, which extends into the ring region 20, starting from the top surface $S_a$ and in such a way as to be arranged, at a distance, between the first and second base regions 32, 120. For example, the diode region 142 has the same thickness and the same doping level as the first and second base regions 32, 120. Furthermore, the diode region 142 is separate from the first and second base regions 32, 120.

The optoelectronic device 10 further comprises an anode region 146, of a P++ type, and a cathode region 148, of an N++ type, which extend, at a distance, within the diode region 142, starting from the top surface $S_a$. Each between the anode region 146 and the cathode region 148 is surrounded laterally and at the bottom by the diode region 142. For example, the anode region 146 may have the same thickness and the same doping level as the first enriched base region 42, whereas the cathode region 148 may have the same thickness and the same doping level as the first emitter regions 44.

Furthermore, the optoelectronic device 10 comprises an anode metallization 150 and a cathode metallization 152, which extend through the third top dielectric region 68 and, respectively, overly the anode region 146 and the cathode region 148, with which they are, respectively, in direct contact. In practice, the diode region 142 forms, together with the anode region 146 and the cathode region 148, a diode, which will be referred to hereinafter as "speed-up diode 155".

Figure 9:
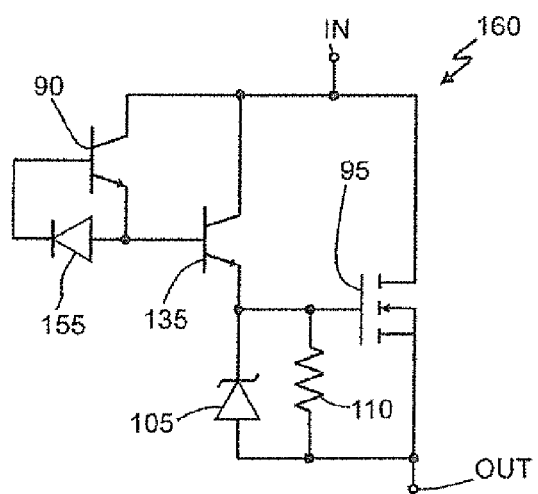

By adopting the embodiment illustrated in FIG. 8, it is possible to form a third electro-optical circuit 160, illustrated in FIG. 9 and described in what follows with reference just to the differences from the second electro-optical circuit 140. In the third electro-optical circuit 160, the cathode of the speed-up diode 155 is connected to the base of the phototransistor 90, while the anode is connected to the emitter of the phototransistor 90.

For practical purposes, the speed-up diode 155 enables an increase in the speed of quenching of the photocurrent present on the emitter of the bipolar transistor 135, after the radiation has ceased to reach the phototransistor 90. The speed-up diode 155 hence speeds up the passage of the MOSFET 95 from the state of conduction to the state of inhibition.

Figure 10:
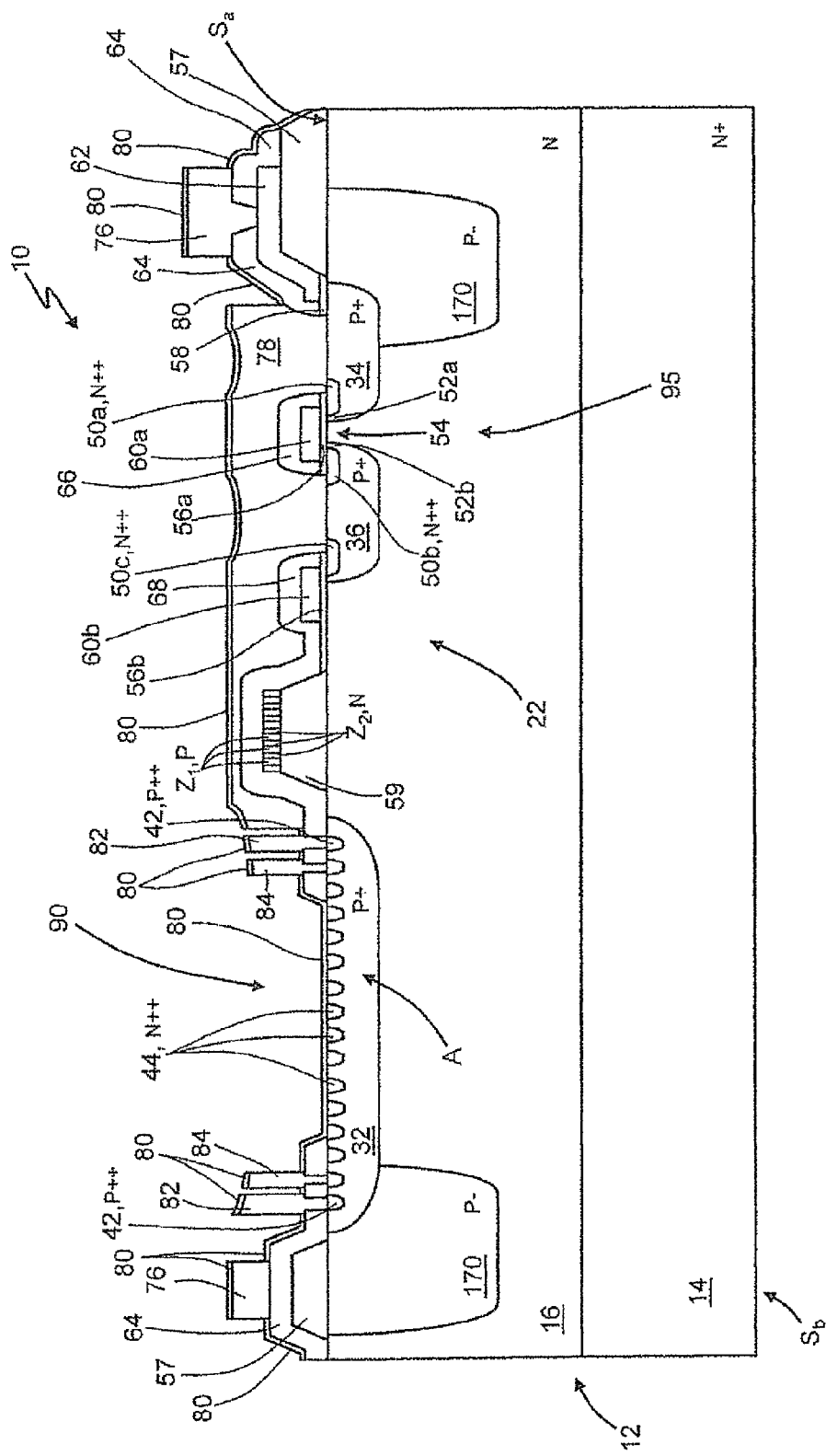
Figure 11:
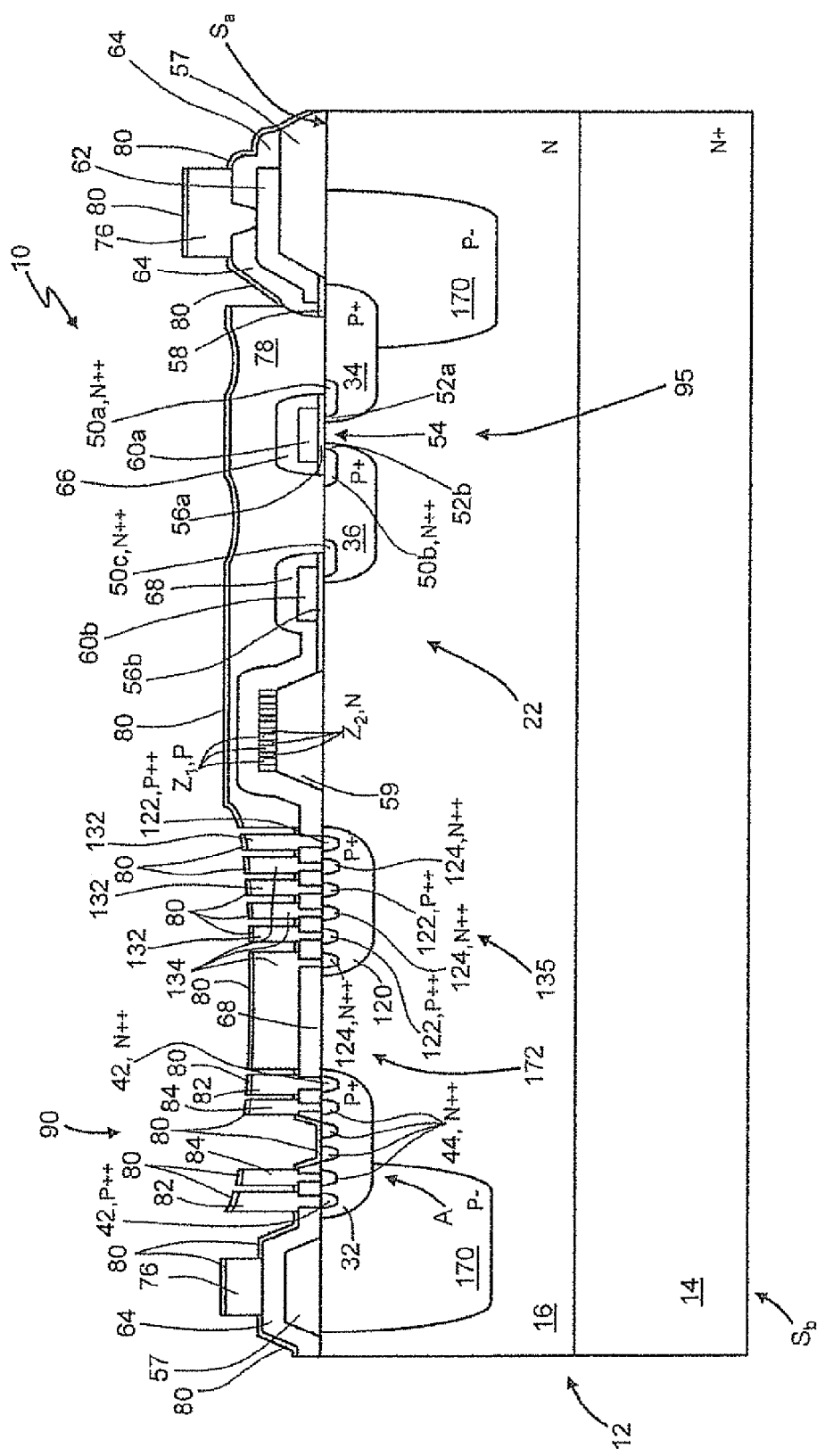
Figure 12:
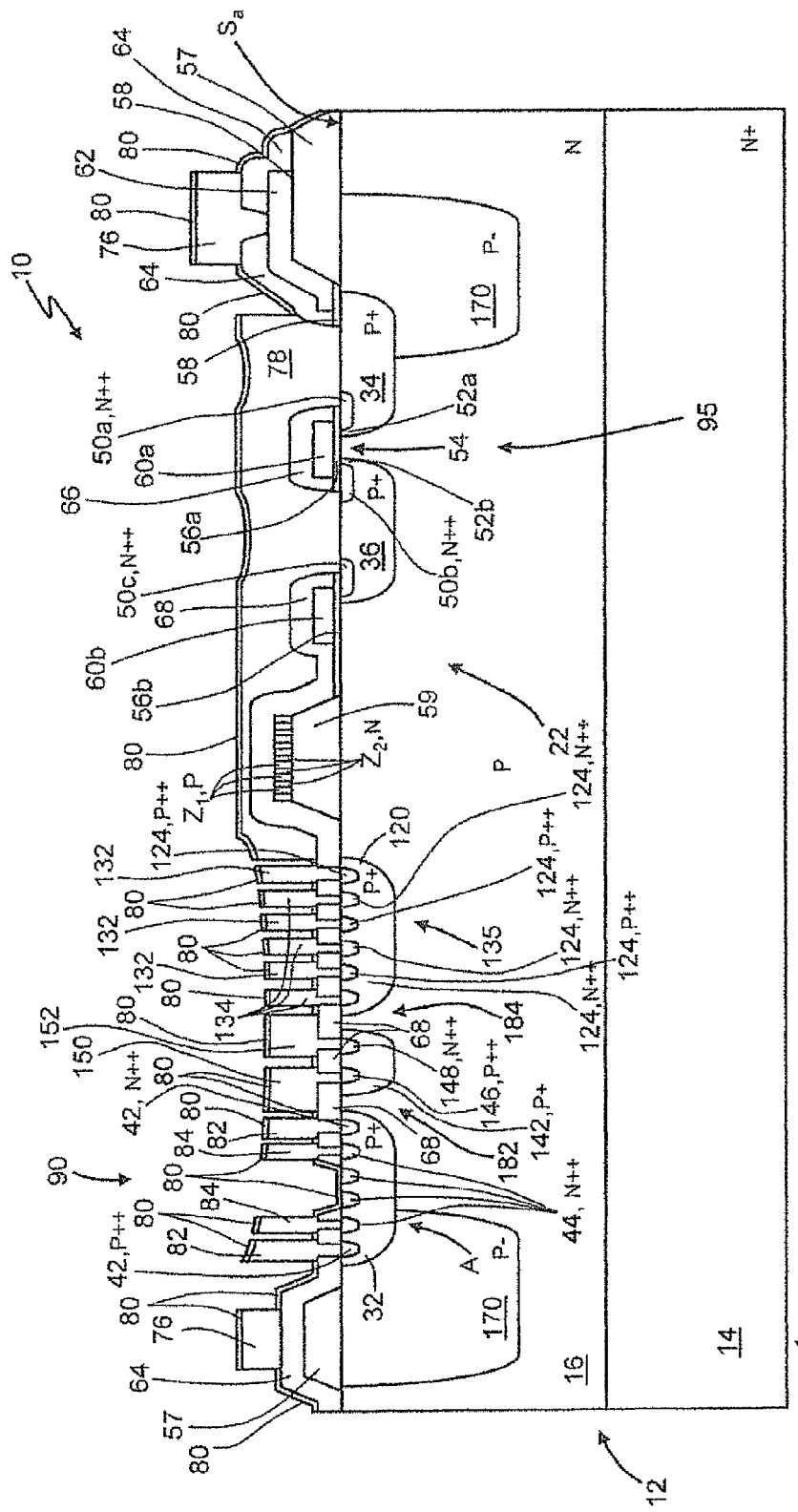

As illustrated in FIGS. 10, 11 and 12, moreover possible are embodiments where the first base region 32 does not extend completely into the ring region, which in FIGS. 10-12 is designated by 170. In particular, the first base region 32 extends partly into the ring region 170, and partly into the epitaxial layer 16. Even more in particular, the first base region 32 contacts laterally the ring region 170 and contacts at the bottom the epitaxial layer 16, and hence extends partly into the internal region 22.

Regarding the second base region 120 and the diode region 142, they are set apart from the ring region 170. Consequently, each between the second base region 120 and the diode region 142 is surrounded at the bottom and laterally by the epitaxial layer 16. In greater detail, as regards the embodiment illustrated in FIG. 11, the first and second base regions 32, 120 delimit an interstitial region 172, which is formed by the epitaxial layer 16 and is arranged between the first and second base regions 32, 120. Furthermore, the second emitter metallization 134 extends laterally so as to overly the portion of third top dielectric region 68 arranged on top of the interstitial region 172. In practice, the second emitter metallization 134 forms a first covering metallization. In this way, the breakdown voltage of the optoelectronic device 10 increases since the lines of the electrical field are prevented from concentrating in the interstitial region 172.

Likewise, as regards the embodiment illustrated in 12, between the first base region 32 and the diode region 142 there extends a first intermediate region 182, formed by the first epitaxial layer 16. In addition, a second intermediate region 184 extends between the diode region 142 and the second base region 120. The anode metallization 150 extends laterally so as to overly the portion of the third top dielectric region 68 arranged on top of the first intermediate region 182. Likewise, the cathode metallization 152 extends laterally so as to overly the top third portion of the dielectric region 68 arranged on top of the second intermediate region 184. In practice, the anode metallization 150 and the cathode metallization 152 form a first covering metallization and a second covering metallization. In this way, the breakdown voltage of the optoelectronic device 10 increases since the lines of the electrical field are prevented from concentrating in the first and second intermediate regions 182 and 184.

In practice, in the embodiments illustrated in FIGS. 10-12, the phototransistor 90 is more sensitive to radiation of shorter wavelength as compared to what occurs in the corresponding embodiments illustrated in FIGS. 2, 6, and 8. In fact, the base-collector junction is closer to the top surface $S_a$.

In all the embodiments described, there may moreover be present a protective layer (not illustrated), which is transparent to the operating wavelength $\lambda$ and is made, for example, of nitride. In particular, the protective layer is arranged on top of the antireflection layer 80, as well as on top of the edge metallization 76, the source metallization 78, the first and second base metallizations 82, 132, the first and second emitter metallizations 84, 134, as well as the anode metallization 150 and cathode metallization 152.

Furthermore, the optoelectronic device 10 can be enclosed within a package (not illustrated) made of a resin transparent to the operating wavelength $\lambda$. Possibly, the resin may be selected so as to filter radiation at a wavelength different from the operating wavelength $\lambda$ so as to reduce the leakage currents within the MOSFET 95, as well as the photocurrent caused by environmental light.

Figure 13:
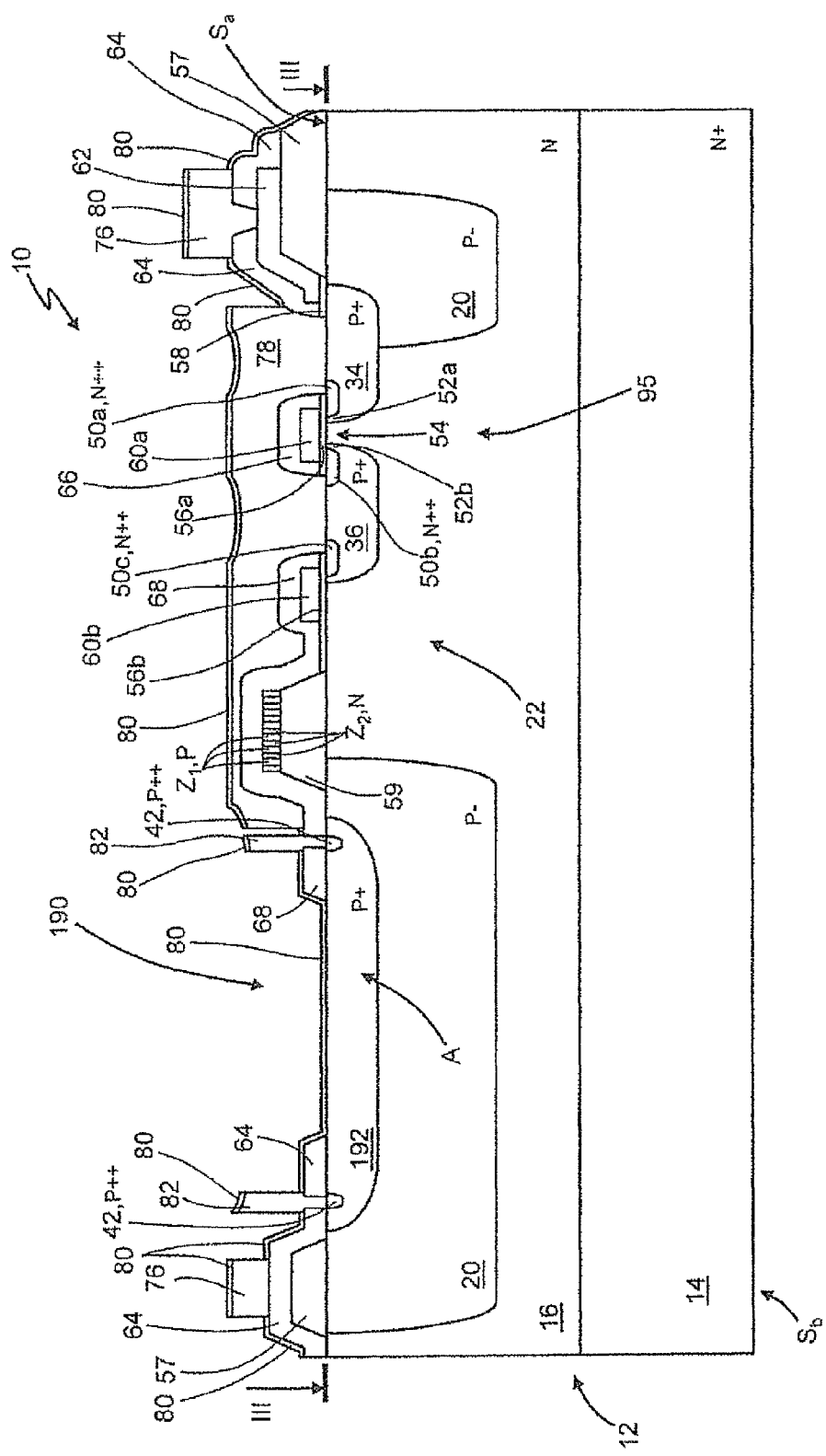

As illustrated in FIG. 13, embodiments are possible in which, instead of the phototransistor, a photodiode 190 is present, as described in what follows with reference just to the differences from the embodiment illustrated in FIG. 2.

In detail, the first emitter regions 44 and the first emitter metallization 84 are absent. Moreover, the first base region (here designated by 192) forms, together with the ring region 20, the anode of the photodiode 190, the cathode of which is formed by the substrate 14. The first base region 192 hence forms a photodetector region, which, together with the ring region 20 and the epitaxial layer 16, forms a PN junction, in the depleted region of which photons can be absorbed, with consequent generation of carriers. In greater detail, in the embodiment illustrated in FIG. 13, the anode of the photodiode 190 is surrounded at the bottom and laterally by the ring region 20. However, there are other possible embodiments in which the anode of the photodiode extends partly into the ring region and partly into the epitaxial layer.

Figure 14:
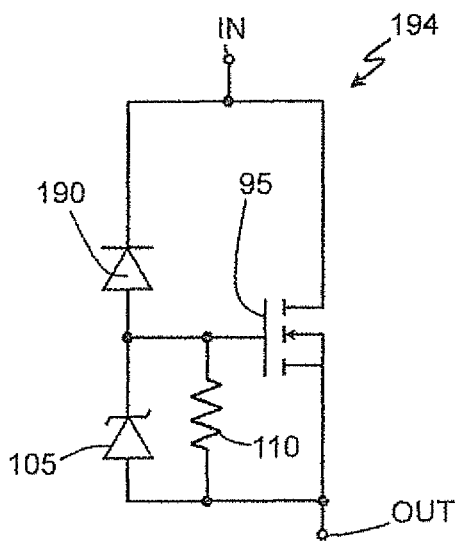

By adopting the embodiment illustrated in FIG. 13, it is possible to form a fourth electro-optical circuit 194, illustrated in FIG. 14 and described in what follows with reference just to the differences from the first electro-optical circuit 100. In particular, the cathode of the photodiode 190 is connected to the input terminal IN, while the anode is connected to the gate electrode of the MOSFET 95. Operation of the fourth electro-optical circuit 194 is similar to that of the first electro-optical circuit 100.

Figure 15:
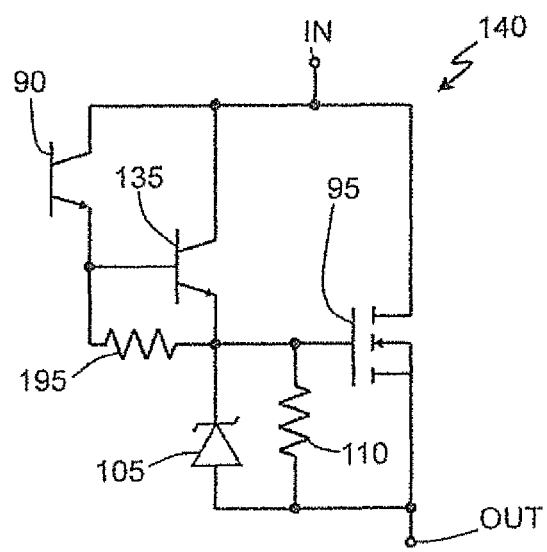

As illustrated in FIG. 15 with reference, without this implying any loss of generality, to the second electro-optical circuit 140, embodiments are possible in which a second resistor 195 is present, which is connected between the emitter of the phototransistor 90 and the emitter of the bipolar transistor 135. The second resistor 195 forms a resistive divider in such a way that a part of the photocurrent at output from the emitter of the phototransistor 90 is drained in the second resistor 195, instead of entering the base of the bipolar transistor 135. In this way, a current threshold is introduced, which depends upon the resistance of the second resistor 195 and is such that, in the case where the photocurrent produced by the phototransistor 90 does not exceed this threshold, the bipolar transistor 135 does not go into conduction. A further mechanism is hence introduced that prevents activation of the electro-optical circuit by the environmental light. By way of example, the second resistor 195 may be of the variable-resistance type so as to enable variation in the current threshold in a controllable way.

Figure 16:
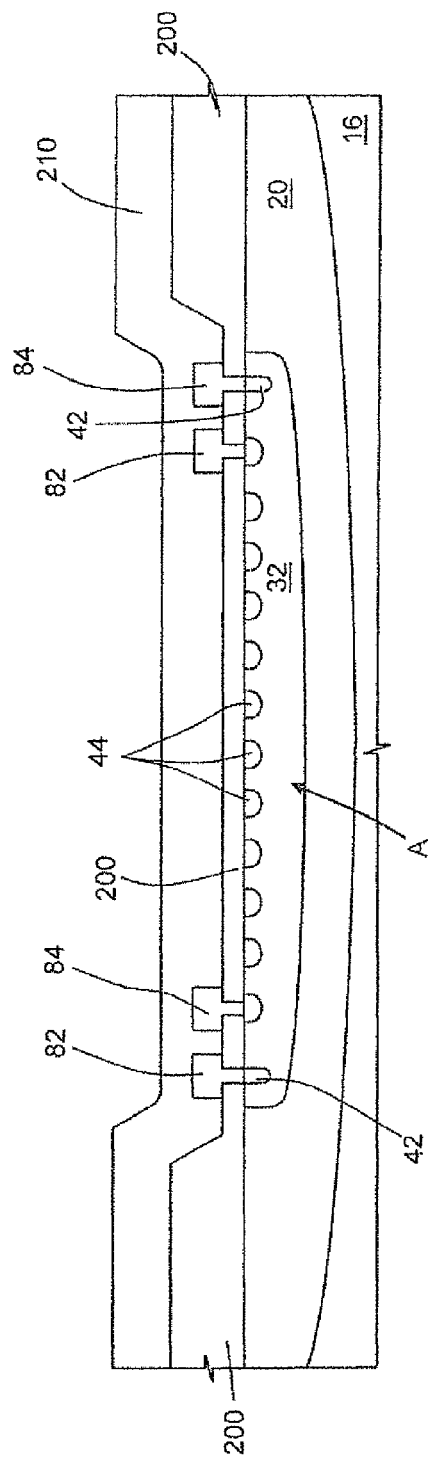
FIGS. 16-19 are schematic cross sections of portions of the present optoelectronic integrated device, during successive steps of a manufacturing process.

The optoelectronic device 10 may be produced with the manufacturing process described in what follows, with particular reference, purely by way of example, to the embodiment illustrated in FIG. 2. In detail, initially (FIG. 16) the phototransistor 90 and the MOSFET 95 are formed, and hence the semiconductor body 12 is formed, i.e., the portion of the optoelectronic device 10 underlying the top surface $S_a$, as well as the first and second gate-oxide regions 56a, 56b, the first and second conductive regions 60a, 60b, and the first and second side regions 58, 62.

There are, moreover, formed a first passivation 200 and a second passivation 210, as well as portions both of the first base metallization 82 and of the first emitter metallization 84. In particular, the first passivation 200 is made of thermal oxide and is designed to form the aforementioned bottom insulating region, i.e., the dielectric edge region 57 and the internal dielectric region 59, whereas the second passivation 210 is made of deposited oxide and is designed to form the first, second, and third top dielectric regions 64, 66, 68.

Figure 17:
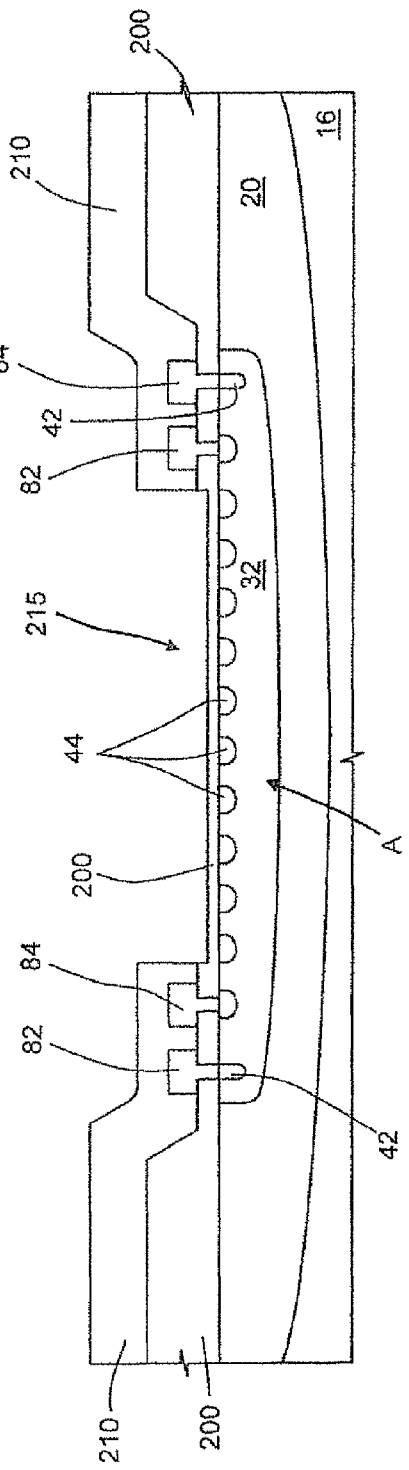

Next (FIG. 17), a first chemical etch of a dry type is made to remove a portion of the second passivation 210 arranged on top of the active area A. The chemical etch is made using a first photolithographic mask (not illustrated), and, moreover, envisages removal of a portion of the first passivation 200, underlying the aforementioned portion of the second passivation 210 and overlying, at a distance, the active area A. In this way, a window 215 is formed, which is arranged on top of the active area A and is delimited laterally by the first and second passivations 200, 210. In particular, due to the use of a dry etch, the side walls of the window 215 are substantially vertical.

Figure 18:
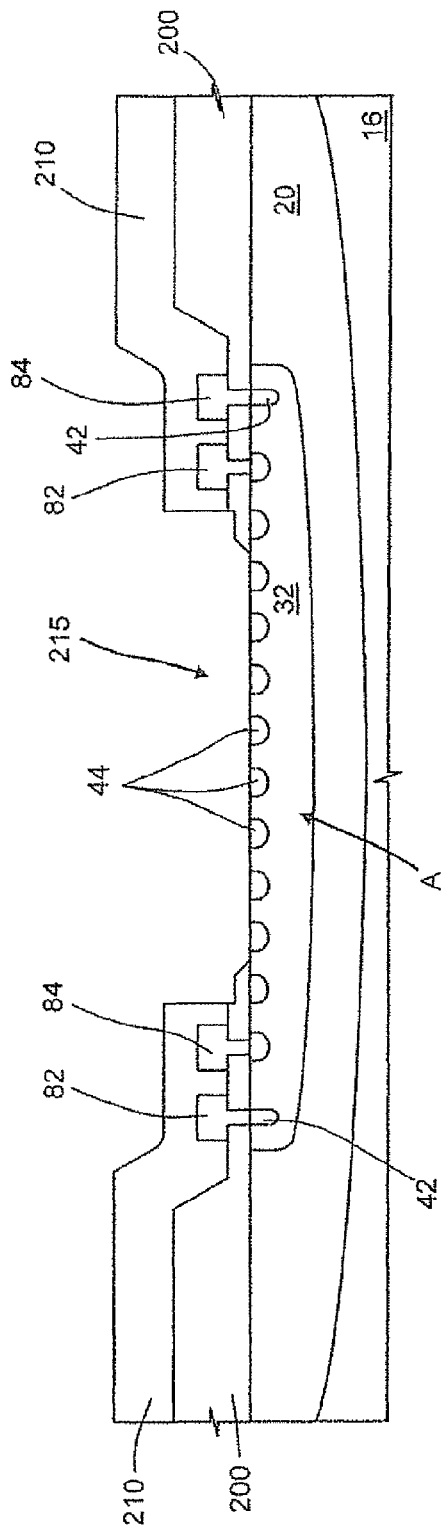
Figure 19:
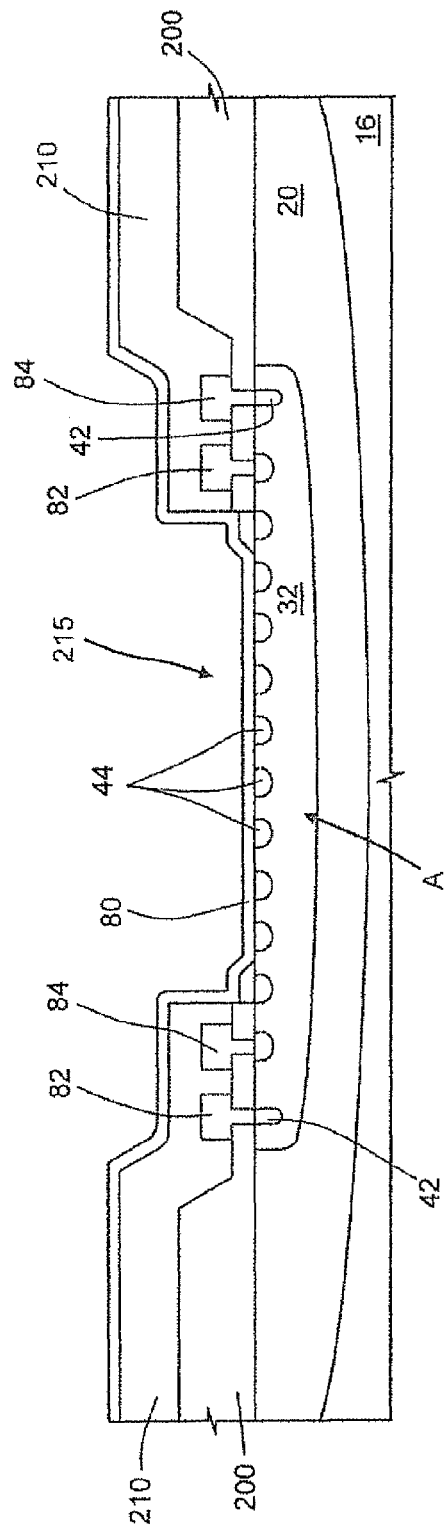

Next (FIG. 18), a second chemical etch is made, which is of a wet type and envisages the use of a second photolithographic mask (not illustrated). The second chemical etch enables removal of the portion of the first passivation 200 arranged on top of the active area A, in contact with the top surface $S_a$. In other words, the second chemical etch enables exposure of the portion of top surface $S_a$ arranged on top of the active area A. Furthermore, since the second chemical etch is of a wet type, it prevents the active area A, i.e., the optically active portion of the semiconductor body 12, from being damaged. Next (FIG. 19), the antireflection layer 80 is deposited on top of the second passivation 210 and within the window 215 in such a way that it contacts the top surface $S_a$, on top of the active area A.

The process for manufacturing the optoelectronic device 10 is then completed. These operations include, among other things, completion of formation of the base metallization 82 and of the emitter metallization 84 in such a way that they pass through the antireflection layer 80.

The advantages that the present optoelectronic integrated device affords emerge clearly from the foregoing description. In particular, it enables provision, within a single integrated circuit, of a photodetector and a power MOSFET, with consequent reduction in the overall dimensions, without this entailing a reduction in the maximum voltages that can be withstood. In fact, both the photodetector and the MOSFET are characterized by high breakdown voltages.

Finally, it is clear that modifications and variations may be made with respect to what has been described and illustrated herein, without thereby departing from the sphere of protection of the present invention, as defined in the annexed claims.

For example, the optoelectronic device may not comprise the Zener diode, which, as on the other hand also the speed-up diode, can hence be of a discrete type and be external with respect to the optoelectronic device. Furthermore, instead of the first emitter regions 44, a single emitter region of an annular shape may be present.

Finally, all the types of doping may be reversed with respect to what has been illustrated and described herein.

That which is claimed:

1. An optoelectronic integrated device comprising:
    a body of semiconductor material, delimited by a front surface and including a substrate having a first type of conductivity, an epitaxial region having the first type of conductivity and defining the front surface, and a ring region having a second type of conductivity, and extending into the epitaxial region starting from the front surface, delimiting an internal region;
    a MOSFET comprising at least one body region having the second type of conductivity, and contacting the ring region and extending at least in part within the internal region from the front surface; and
    a photodetector comprising a photodetector region having the second type of conductivity, and extending into the body of semiconductor material from the front surface, contacting the ring region.

2. The optoelectronic device according to claim 1, wherein the photodetector defines a phototransistor, the photodetector region comprising a first base region having a doping level higher than the doping level of the ring region; and wherein the first base region extends into the ring region so as to be surrounded at a bottom and laterally by the ring region.

3. The optoelectronic device according to claim 2, further comprising a bipolar transistor including a second base region having the second type of conductivity, and having a doping level higher than the doping level of the ring region and extending into the ring region from the front surface so as to be surrounded at a bottom and laterally by the ring region, the second base region being laterally set apart from the first base region, the bipolar transistor further comprising at least one transistor-emitter region having the first type of conductivity and extending into the second base region from the front surface.

4. The optoelectronic device according to claim 3, wherein the bipolar transistor further comprises:
    at least one enriched transistor-base region having the second type of conductivity and with a higher doping level than the doping level of the second base region, and extending into the second base region from the front surface, and being laterally set apart from the transistor-emitter region; and
    a transistor-base metallization and a transistor-emitter metallization, which overlie, respectively, the enriched transistor-base region and the transistor-emitter region, so as to shield photons directed, respectively, towards the enriched transistor-base region and the transistor-emitter region.

5. The optoelectronic device according to claim 3, further comprising:
    a diode region having the second type of conductivity and extending into the ring region from the front surface and laterally set apart from the first and second base regions; and
    an anode region and a cathode region extending into the diode region from the front surface, the cathode region having the first type of conductivity, the anode region having the second type of conductivity and having a doping level higher than the doping level of the diode region.

6. The optoelectronic device according to claim 1, wherein the photodetector defines a phototransistor, the photodetector region comprising a first base region having a doping level higher than the doping level of the ring region; and wherein part of the first base region extends into the internal region.

7. The optoelectronic device according to claim 6, further comprising a bipolar transistor comprising a second base region having the second type of conductivity, and extending into the internal region from the front surface, the second base region being laterally set apart from the first base region and being surrounded at the bottom and laterally by the internal region, the bipolar transistor further comprising at least one transistor-emitter region having the first type of conductivity and extending into the second base region from the front surface.

8. The optoelectronic device according to claim 7, wherein the bipolar transistor further comprises:
   at least one enriched transistor-base region having the second type of conductivity and with a doping level higher than the doping level of the second base region, and extending into the second base region from the front surface and is laterally set apart from the transistor-emitter region; and
   a transistor-base metallization and a transistor-emitter metallization, which overlie, respectively, the enriched transistor-base region and the transistor-emitter region so as to shield photons directed, respectively, towards the enriched transistor-base region and the transistor-emitter region.

9. The optoelectronic device according to claim 7, wherein the first and second base regions delimit laterally an interstitial region defined by the internal region, arranged between the first and second base regions and underneath the front surface; and further comprising a first covering metallization, which overlies the interstitial region.

10. The optoelectronic device according to claim 7, further comprising a diode region having the second type of conductivity and extending into the internal region from the front surface, and being laterally set apart from the first and second base regions; and further comprising an anode region and a cathode region which extend into the diode region from the front surface, the cathode region having the first type of conductivity, the anode region having the second type of conductivity and having a doping level higher than the doping level of the diode region; and wherein the first base region and the diode region delimit laterally a first intermediate region, and the second base region and the diode region delimit laterally a second intermediate region, the first and second intermediate regions being arranged underneath the front surface and being defined by the internal region; and further comprising a first covering metallization and a second covering metallization, which overlie, respectively, the first and second intermediate regions.

11. The optoelectronic device according to claim 2, wherein the phototransistor further comprises at least one phototransistor-emitter region having the first type of conductivity and extending into the first base region from the front surface; and wherein the MOSFET further comprises:
   at least one source region having the first type of conductivity and extending into the body region from the front surface;
   at least one gate-dielectric region extending on top of the front surface so as to contact the source region and the body region; and
   at least one conductive region overlying and directly contacting the gate-dielectric region.

12. The optoelectronic device according to claim 1, further comprising an antireflection layer arranged on top of the front surface and overlying, in direct contact, the photodetector region.

13. The optoelectronic device according to claim 1, further comprising an edge structure extending over the front surface so as to overly the ring region, and comprising:
   a dielectric edge-structure region contacting the ring region; and
   a metal edge-structure region arranged on top of the dielectric edge-structure region.

14. An electro-optical circuit comprising:
an input terminal configured to receive a supply voltage;
an output terminal configured to be coupled to a load;
an optoelectronic device comprising
   a body of semiconductor material, delimited by a front surface and including a substrate having a first type of conductivity, an epitaxial region having the first type of conductivity and defining the front surface, and a ring region having a second type of conductivity, and extending into the epitaxial region starting from the front surface, delimiting an internal region,
   a MOSFET comprising at least one body region having the second type of conductivity, and contacting the ring region and extending at least in part within the internal region from the front surface, and
   a phototransistor comprising a photodetector region having the second type of conductivity, and extending into the semiconductor body from the front surface, contacting the ring region,
   wherein each of the phototransistor and the MOSFET comprises a respective first conduction electrode, a respective second conduction electrode, and a respective control electrode, and wherein the phototransistor is configured generate a photocurrent, corresponding to received radiation, on the second conduction electrode thereof; and
   wherein the first and second conduction electrodes of the phototransistor are coupled, respectively, to the input terminal and to the control electrode of the MOSFET, the first and second conduction electrodes of the MOSFET being coupled, respectively, to the input terminal and to the output terminal; and
a first resistor coupled between the control electrode of the MOSFET and the output terminal so that, when the photocurrent exceeds a threshold, a voltage is generated on the first resistor that causes switching of the MOSFET from a non-conducting state to a conducting state and causing supply of the load.

15. The electro-optical circuit according to claim 4 further comprising a Zener diode coupled between the control electrode of the MOSFET and the output terminal.

16. An electro-optical circuit comprising:
an input terminal configured to receive a supply voltage;
an output terminal configured to be coupled to a load;
an optoelectronic device comprising
   a body of semiconductor material, delimited by a front surface and including a substrate having a first type of conductivity, an epitaxial region having the first type of conductivity and defining the front surface, and a ring region having a second type of conductivity, and extending into the epitaxial region starting from the front surface, delimiting an internal region,
   a MOSFET comprising at least one body region having the second type of conductivity, and contacting the ring region and extending at least in part within the internal region from the front surface, and
   a phototransistor comprising a photodetector region having the second type of conductivity, and extending into the semiconductor body from the front surface, contacting the ring region, the photodetector region comprising a first base region having a doping level higher than the doping level of the ring region, and the first base region extending into the ring region so as to be surrounded at a bottom and laterally by the ring region,
   a bipolar transistor including a second base region having the second type of conductivity, and having a doping level higher than the doping level of the ring region and extending into the ring region from the front surface so as to be surrounded at a bottom and laterally by the ring region, the second base region being laterally set apart from the first base region, the bipolar transistor further comprising at least one transistor-emitter region having the first type of conductivity and extending into the second base region from the front surface, wherein each of the phototransistor, the bipolar transistor, and the MOSFET comprises a respective first conduction electrode, a respective second conduction electrode, and a respective control electrode, and wherein the first and second conduction electrodes of the phototransistor are coupled, respectively, to the input terminal and to the control electrode of the bipolar transistor, the first and second conduction electrodes of the bipolar transistor are coupled, respectively, to the input terminal and to the control electrode of the MOSFET, the first and second conduction electrodes of the MOSFET being, respectively, coupled to the input terminal and to the output terminal; and a first resistor coupled between the control electrode of the MOSFET and the output terminal.

17. The electro-optical circuit according to claim 16, further comprising a Zener diode coupled between the control electrode of the MOSFET and the output terminal.

18. The electro-optical circuit according to claim 17, further comprising a second resistor coupled between the second conduction electrode of the phototransistor and the second conduction electrode of the bipolar transistor.

19. An electro-optical circuit comprising an input terminal configured to be set at a supply voltage;

an output terminal configured to be coupled to a load;

an optoelectronic device comprising a body of semiconductor material, delimited by a front surface and including a substrate having a first type of conductivity, an epitaxial region having the first type of conductivity and defining the front surface, and a ring region having a second type of conductivity, and extending into the epitaxial region starting from the front surface, delimiting an internal region, a MOSFET comprising at least one body region having the second type of conductivity, and contacting the ring region and extending at least in part within the internal region from the front surface, and a phototransistor comprising a photodetector region having the second type of conductivity, and extending into the semiconductor body from the front surface, contacting the ring region, the photodetector region comprising a first base region having a doping level higher than the doping level of the ring region, and the first base region extending into the ring region so as to be surrounded at a bottom and laterally by the ring region, a bipolar transistor including a second base region having the second type of conductivity, and having a doping level higher than the doping level of the ring region and extending into the ring region from the front surface so as to be surrounded at a bottom and laterally by the ring region, the second base region being laterally set apart from the first base region, the bipolar transistor further comprising at least one transistor-emitter region having the first type of conductivity and extending into the second base region from the front surface, a diode region having the second type of conductivity and extending into the ring region from the front surface and laterally set apart from the first and second base regions, an anode region and a cathode region extending into the diode region from the front surface, the cathode region having the first type of conductivity, the anode region having the second type of conductivity and having a doping level higher than the doping level of the diode region, wherein each of the phototransistor, the bipolar transistor, and the MOSFET comprises a respective first conduction electrode, a respective second conduction electrode, and a respective control electrode, wherein the first and second conduction electrodes of the phototransistor are coupled, respectively, to the input terminal and to the control electrode of the bipolar transistor, the first and second conduction electrodes of the bipolar transistor are coupled, respectively, to the input terminal and to the control electrode of the MOSFET, the first and second conduction electrodes of the MOSFET are respectively coupled to the input terminal and to the output terminal, and wherein the cathode region and the anode region are respectively coupled to the control electrode and to the second conduction electrode of the phototransistor; and a first resistor coupled between the control electrode of the MOSFET and the output terminal.

20. The electro-optical circuit according to claim 19, further comprising a second resistor coupled between the second conduction electrode of the phototransistor and the second conduction electrode of the bipolar transistor.

21. The electro-optical circuit according to claim 19 further comprising a Zener diode coupled between the control electrode of the MOSFET and the output terminal.

22. A method for manufacturing an optoelectronic integrated device, the method comprising:

forming a body of semiconductor material, delimited by a front surface, and including forming a substrate having a first type of conductivity, forming an epitaxial region having the first type of conductivity and defining the front surface, and forming a ring region having a second type of conductivity and extending into the epitaxial region from the front surface, and defining an internal region;

forming a MOSFET including forming a body region having the second type of conductivity so that it contacts the ring region and extends at least in part within the internal region from the front surface; and forming a photodetector including forming a photodetector region having the second type of conductivity and extending into the body of semiconductor material from the front surface and contacting the ring region.

23. The method according to claim 22 further comprising forming an antireflection layer over the front surface so that it overlies, in direct contact, the photodetector region.

24. The method according to claim 23, further comprising:

forming a first passivation region on top of the front surface; and forming a second passivation region on top of the first passivation region;

and wherein forming the antireflection layer comprises:

selectively removing, with a first dry-type chemical etch, a portion of the second passivation region arranged on top of the photodetector region, selectively removing, with a second wet-type chemical etch, a portion of the first passivation region arranged on top of the photodetector region, so as to expose at least a portion of the photodetector region, and forming the antireflection layer on top of the exposed portion of the photodetector region.

\* \* \* \* \*

UNITED STATES PATENT AND TRADEMARK OFFICE
CERTIFICATE OF CORRECTION

| | |
|---|---|
| PATENT NO. | : 9,305,907 B2 |
| APPLICATION NO. | : 14/206328 |
| DATED | : April 5, 2016 |
| INVENTOR(S) | : Areuri et al. |

It is certified that error appears in the above-identified patent and that said Letters Patent is hereby corrected as shown below:

In the Claims

Column 16, Line 39,   Delete: "4"
Claim 15              Insert --14--

Signed and Sealed this
Ninth Day of August, 2016

Michelle K. Lee
*Director of the United States Patent and Trademark Office*